United States Patent [19]
Fernelius et al.

[11] Patent Number: 5,980,789
[45] Date of Patent: Nov. 9, 1999

[54] MODIFIED GALLIUM SELENIDE CRYSTALS FOR HIGH POWER NONLINEAR OPTICAL APPLICATIONS

[75] Inventors: Nils C. Fernelius, Troy, Ohio; Narsingh B. Singh, Export, Pa.; Dennis R. Suhre; Vijay Balakrishna, both of Monroeville, Pa.

[73] Assignee: The United States of America as represented by the Secretary of the Air Force, Washington, D.C.

[21] Appl. No.: 09/058,125

[22] Filed: Apr. 10, 1998

[51] Int. Cl.⁶ .............................. F21V 9/00; G02B 5/20; G02F 1/35; C01B 19/04
[52] U.S. Cl. .......................... 252/582; 252/584; 359/328; 423/266; 423/275; 423/508; 423/509
[58] Field of Search ..................................... 252/582, 584; 359/326, 328; 423/266, 275, 508, 509

[56] References Cited

U.S. PATENT DOCUMENTS 5,141,564  8/1992  Chen et al. .
5,162,939  11/1992  Herron et al. ........................... 252/582

OTHER PUBLICATIONS

D.R. Suhre et al., "Six–Watt Mid–Infrared Laser using Harmonic Generation with Tl₃AsSe₃," *Applied Physics B*, vol. 63, pp. 225–228, (1996).

G.C. Bhar et al., "Nonlinear Optical Laser Devices using GaSe," *Applied Physics B*, vol. 61, pp. 187–190, (1995).

K.L. Vodopyanov et al., "2.8 μm Laser Pumped Type I and Type III Traveling–wave Optical Parametric Generator in GaSe," *Optics Communications*, vol. 114, pp. 333–335, (1995).

K.L. Vodopyanov et al., "Parametric Generation of Tunable Infrared Radiation in ZnGeP₂ and GaSe Pumped at 3 μm," *J. Opt. Soc. Am. B*, vol. 10, pp. 1723–1729,(1993).

G.B. Abdullaev et al., "Efficient Generation of the Second Harmonic of CO₂ Laser Radiation in a GaSe Crystal," *Soviet Journal of Quantum Electronics*, vol. 19, No. 4, pp. 494–498,(1989).

A. Bianchi et al., "Down–Conversion in the 4–18μ Range with GaSe and AgGaSe₂ Nonlinear Crystals," *Optics Communications*, vol. 30, No. 1, pp. 122–124,(1979).

J.L. Oudar et al., "Medium Infrared Tunable Down Conversion of a YAG–Pumped Infrared Dye Laser in Gallium Selenide," *Optics Communications*, vol. 29, No. 1, pp. 119–112,(1979).

G.B. Abdullaev et al., "Difference Frequency Generation in a GaSe Crystal with Continuous Tuning in the 560–1050 cm⁻¹ Range," *Soviet J. Quantum Electron.*, vol. 6, No. 1, pp. 88–90,(1976).

G.B. Abdullaev et al., "A New Effective Material for Nonlinear Optics," *Soviet Physics JETP Letters*, vol. 16, pp. 130–133,(1972).

G.D. Boyd et al., "Parametric Interaction of Focused Gaussian Light Beams," *Journal of Applied Physics*, vol. 39, No. 8, pp. 3597–3639,(1968).

*Primary Examiner*—Philip Tucker
*Attorney, Agent, or Firm*—Fredric L. Sinder; Thomas L. Kundert

[57] ABSTRACT

A new method for improving the mechanical properties and nonlinear optical performance characteristics of gallium selenide crystals (GaSe) is disclosed. A charge of GaSe crystals was doped with indium before being made into a crystal. The indium-doped GaSe crystals have improved physical properties in that they can be cut along the cleave planes and the cleaved surfaces polished without the usual delaminations typically observed in prior art pure GaSe crystals. The indium-doped crystals were tested in a second harmonic generation (SHG) system and found to have nearly twice the SHG efficiency as pure, or undoped, GaSe crystals.

10 Claims, 4 Drawing Sheets

MODIFIED GALLIUM SELENIDE CRYSTALS FOR HIGH POWER NONLINEAR OPTICAL APPLICATIONS

RIGHTS OF THE GOVERNMENT

The invention described herein may be manufactured and used by or for the Government of the United States for all governmental purposes without the payment of any royalty.

BACKGROUND OF THE INVENTION

The present invention relates generally to nonlinear optical materials, and more specifically to improving the mechanical properties and nonlinear optical performance characteristics of gallium selenide crystals.

Nonlinear optical (NLO) materials, particularly NLO crystals, are increasingly valuable for such uses as frequency conversion. Frequency conversion converts, or shifts, monochromatic, generally laser, light to a useful higher or lower frequency not directly available from a conventional laser source. Frequency conversion using NLO materials can be achieved through such NLO methods as second harmonic generation (SHG), optical parametric generation and difference frequency conversion with tunable lasers.

Second harmonic generation is generally used to double the frequency (half the wavelength) of far-infrared carbon dioxide lasers. Optical parametric generation is generally used to double the wavelength of various near-infrared solid-state lasers. The frequency conversion process in a crystal material is only efficient along certain crystallographic directions known as "phase matching" directions.

Several NLO crystals such as thallium arsenic selenide (TAS), silver gallium selenide ($AgGaSe_2$) and zinc germanium phosphide ($ZnGeP_2$) are being developed as potential candidates for frequency conversion. These crystals are capable of generating the second and higher order harmonic wavelengths necessary for frequency conversion. Second and higher order harmonic wavelengths are also necessary for various other applications in the mid-IR wavelength region. For example, TAS is used for frequency conversion of a $CO_2$ laser from wavelengths of 10.6 $\mu$m to 5.3 $\mu$m. However, the use of TAS crystals is limited to low power applications due to its low thermal conductivity. In high power applications, a thermal lensing effect (the index of refraction increases with intensity and temperature in these materials, creating a thermal lensing effect at higher intensities and temperatures) causes cracks in the crystal. A problem with $AgGaSe_2$ is that it has an absorption peak at ~2 $\mu$m, the desired pump wavelength for applications in the 3–5 $\mu$m atmospheric window.

Gallium selenide (GaSe) is a highly efficient NLO material with a wide transmission range from 0.65 to 18 $\mu$m and has a substantial potential for use in tunable laser light sources in the mid-infrared range. It can be phase matched for both type I and type II SHG and has been used for difference frequency generation and for optical parametric generation.

A particular advantage of GaSe is its potential applicability for use in high power applications. Not only does GaSe exhibit high thermal conductivity, but its optical axis is perpendicular to its preferred direction of thermal conductivity, thereby desirably increasing its ability to conduct thermal energy away from its optical axis.

The major stumbling block preventing widespread use of GaSe is that it cleaves easily along planes perpendicular to the crystal c-axis, making cutting and polishing optical faces difficult.

Thus it is seen that there is a need for GaSe crystals having improved structural properties suitable for use as NLO crystals, particularly for GaSe crystals having improved fabricability.

It is, therefore, a principal object of the present invention to provide improved GaSe crystals which exhibit a significant reduction in cleaving tendency over prior art GaSe crystals.

It is another object of the present invention to improve the second harmonic generation efficiency of GaSe crystals.

It is a feature of the present invention that GaSe crystals made according to the teachings of the present invention are of a higher optical quality than pure GaSe crystals.

It is another feature of the present invention that the bulk optical transmission characteristics of GaSe crystals made according to the teachings of the present invention are not affected by use of the invention.

It is an advantage of the present invention that it allows cutting and polishing of optical faces of GaSe crystals along arbitrary directions.

It is another advantage of the present invention that GaSe crystals made according to the teachings of the present invention have higher structural integrity and stability than prior art GaSe crystals.

It is a further advantage of the present invention that the ability of GaSe crystals to withstand high thermal energies is not lessened by modifications made according to the teachings of the present invention.

These and other objects, features and advantages of the present invention will become apparent as the description of certain representative embodiments proceeds.

SUMMARY OF THE INVENTION

In accordance with the foregoing principles and objects of the present invention, a novel method for improving the physical properties and NLO performance of GaSe crystals is described. The unique discovery of the present invention is that doping a GaSe crystal with indium produces GaSe crystals with both improved structural properties and improved second harmonic generation efficiency.

Accordingly, the present invention is directed to a method for making a NLO crystal, comprising the steps of providing GaSe, doping the GaSe with indium, and forming a crystal from the indium-doped GaSe. The level of indium doping may be about 3000 ppm.

The present invention is also drawn to a composition of matter, comprising an indium-doped GaSe crystal. The level of indium doping may be about 3000 ppm.

The present invention is further directed to a composition of matter, consisting of an indium-doped GaSe crystal. The level of indium doping may be about 3000 ppm.

The present invention is still also directed to a method for converting the frequency of a monochromatic source to a different frequency, comprising the steps of providing a source of monochromatic light at a preselected frequency and optically coupling the output from the source of monochromatic light to a crystal of indium-doped GaSe. The level of indium doping may be about 3000 ppm.

The present invention is still further directed to a frequency conversion apparatus, comprising a source capable of producing monochromatic light at a preselected frequency and an indium-doped GaSe crystal optically coupled with the source of monochromatic light. The level of indium doping may be about 3000 ppm.

BRIEF DESCRIPTION OF THE DRAWINGS

The present invention will be more clearly understood from a reading of the following detailed description in conjunction with the accompanying drawings wherein.

DETAILED DESCRIPTION

Figure 1:
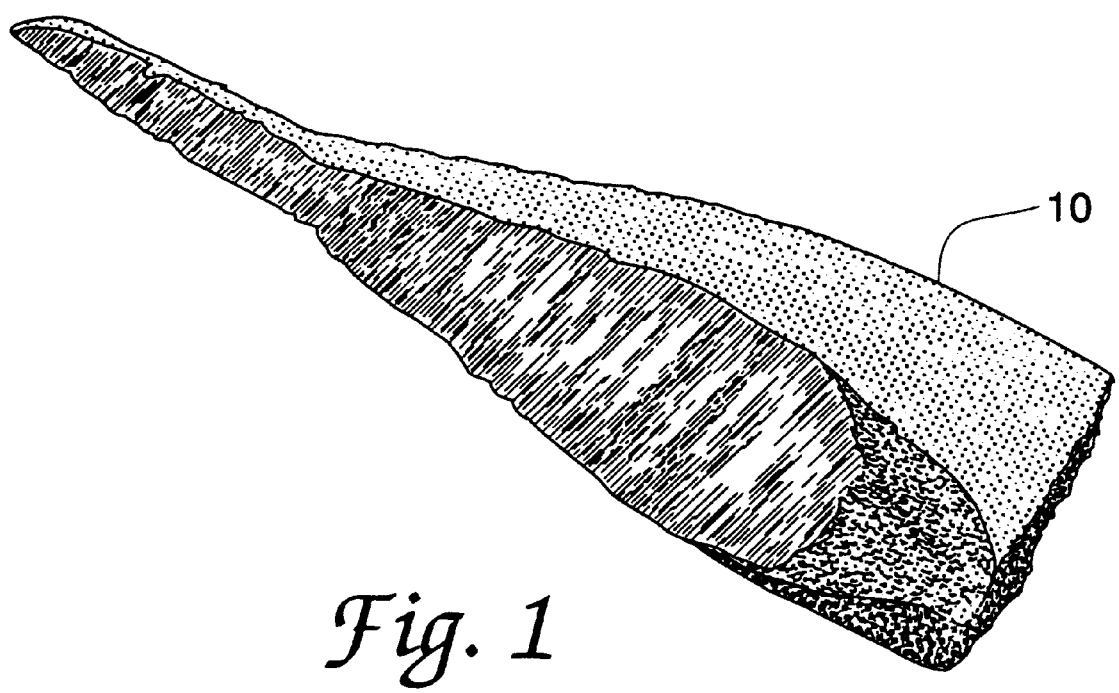
FIG. 1 is a representative drawing of a cleaved GaSe crystal made according to the teachings of the present invention.

Referring now to FIG. 1 of the drawings, there is shown a photomicrograph of a GaSe crystal 10 made according to the teachings of the present invention. To make the GaSe crystal, a GaSe charge was prepared by reacting elemental Ga and Se in their stoichiometric ratio in a quartz tube. Both elements were supplied at a purity level of 99.999% or better. The charge was then doped with 3097 ppm indium. The quartz tube had been first well cleaned, after which the charge was introduced inside the tube and the tube then evacuated and sealed inside a vacuum. Charges up to 100 gms in weight have been prepared. A reaction was carried out in a horizontal furnace maintained at 1000° C. The temperature was gradually raised in steps to prevent explosive reactions. The temperature was raised from ambient to 500° C. in about 5 hours. The reacted mixture was then placed in a well cleaned quartz tube with a capillary. This method is sufficient to typically grow crystals 1 cm in diameter and about 4 cms long. The tube was evacuated and heated in a vacuum to remove moisture from the charge and then sealed. The tube was next placed in a two-zone vertical Bridgman furnace. The temperature was maintained at approximately 1000° C. with a gradient of about 28° C./cm. The melt was perturbed a few times to ensure proper mixing and the growth tube then lowered at a rate of about 7–10 cms/day. After the tube had traveled about 12 cms, the furnace was gradually allowed to cool.

The resulting as-grown boule was polished on one side to produce an optical face to test its fabricability. One side of the boule was ground with a 600 grit sandpaper until a face about 5 mm wide was obtained. This face was subsequently polished with Linde B (an $Al_2O_3$ solution). Significant improvements in the polishing characteristics were observed. The crystal accepted polishing along the entire length of the boule without any delaminations. Moreover, the crystal was able to be cut along the cleave planes and the cleaved surfaces polished without the usual delaminations typically observed in GaSe crystals.

The resulting GaSe crystal also exhibited improved optical performance characteristics, particularly improved second harmonic generation efficiency.

An experiment demonstrating the improved second harmonic generation efficiency was performed. Two GaSe crystals were grown, one pure and the other doped with 3000 ppm In. Both crystals were grown along the c axis and were cut into various lengths by cleaving the optical faces perpendicular to the c axis. The cleaved faces were used directly and anti-reflection coatings were not applied.

Figure 2:
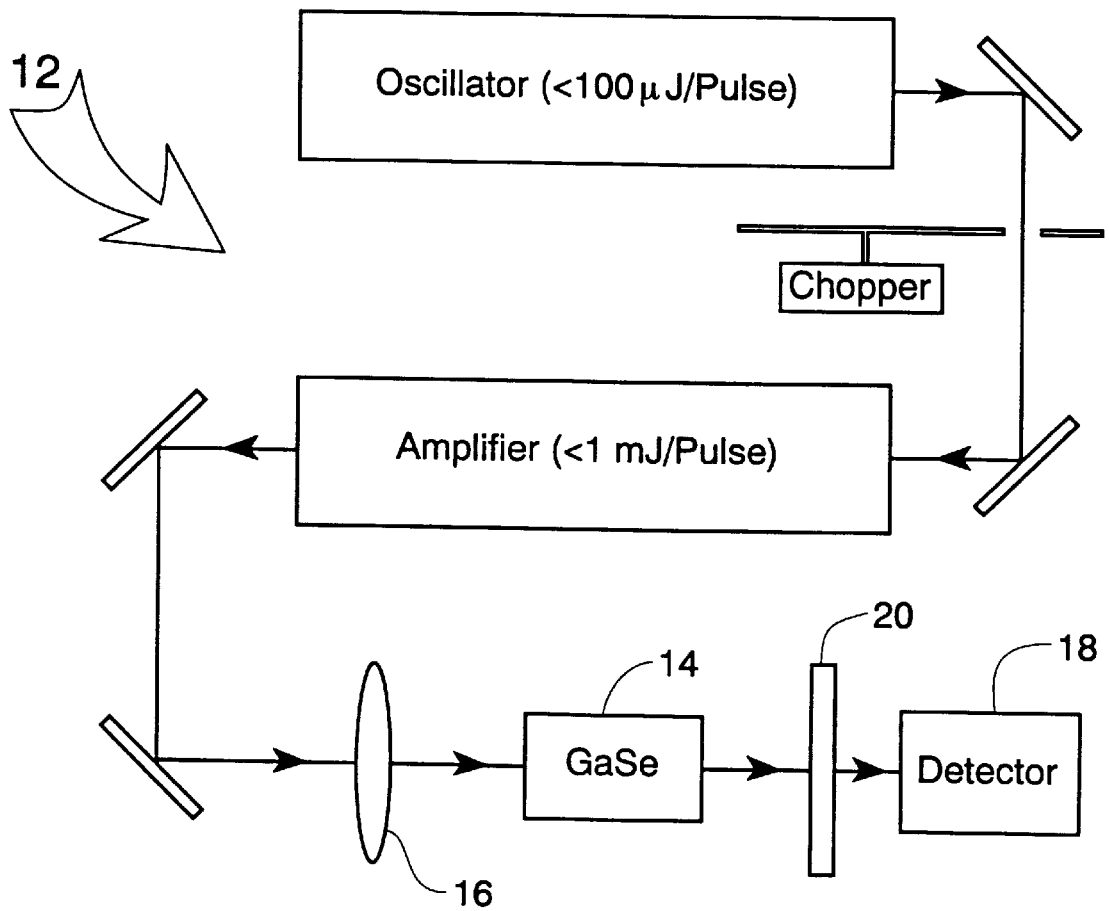
FIG. 2 is a schematic diagram of a SHG frequency conversion system for testing the SHG efficiency of a GaSe crystal made according to the teachings of the present invention.

FIG. 2 shows a laser system 12 used to test the SHG efficiency of an indium-doped GaSe crystal 14. Laser system 12 is a $CO_2$ laser system tuned to the 9R(24) transition at 9.25 μm was used at the source. This system is described in D. R. Suhre and L. H. Taylor, "Six-Watt Mid-Infrared Laser Using Harmonic Generation with $Tl_3AsSe_3$," Appl. Phys. B, vol. 63, pp. 225–228 (1996). The output of the system has a pulse width of 20 ns and the pulse energy was variable up to ~1 mJ. The repetition rate was fixed at 1 kHz for all measurements.

The output was focused with a ZnSe lens 16 with a 23-cm focal length and the GaSe crystals 14 were oriented in a confocal configuration with the center of the crystal at the focus. The position was determined by varying the position and orientation of the crystal until a maximum SHG output was observed. At that point, it was assumed that the confocal condition was achieved.

The laser beam was found to approximate closely a Gaussian profile at the lens. This was determined by placing an aperture at the position of the lens and measuring the energy that passed through the aperture as a function of the aperture size. The Gaussian spot size at the beam waist $\omega_0$ was then determined to be 150 μm when Gaussian propagation from the lens to the beam waist was used.

The pulse energy in both the fundamental beam at 9.25 μm and the doubled beam was measured with a pyroelectric detector 18. Since the response of a thermal detector is constant for both wavelengths, the SHG efficiency could be obtained directly. A 3-mm thick sapphire plate 20 was used to separate the two wavelengths and the Fresnel losses of the two surfaces of the plate were factored into the efficiency measurement.

Type I phase matching was used, with ordinary input and extraordinary output. Each GaSe crystal, both indium-doped and pure, was oriented at ~40° to the input beam axis. Using a refractive index of 2.82 from the Sellmeier equations, described in K. L. Vodopyanov, "Parametric Generation of Tunable Infrared Radiation in $ZnGeP_2$ and GaSe Pumped at 3 μm," J. Opt. Soc. Am. B, vol. 10, pp. 1723–1729 (1993)), this gives an internal phase matching angle of ~13°, which is consistent with a recent measurement at 9.25 μm of 12.60. The transmission of the fundamental beam was measured, which indicated that most of the losses were due to Fresnel reflections at the surfaces and that little absorption was occurring within the GaSe crystals. This is expected due to the low absorption coefficient of GaSe in this wavelength region, which is less than 0.05/cm.

The crystal orientation was optimized for SHG efficiency, the SHG output was measured through the sapphire plate and the fundamental plus SHG was measured without the plate. After accounting for the Fresnel losses of the sapphire plate, the measurements were divided to obtain the efficiency ratio. Since the indices of refraction are identical for the fundamental and harmonic beams under phase-matched conditions, the reflection losses are the same when the beam exits the crystal. Therefore, these losses do not do not have to be factored into the energy ratio to determine the SHG efficiency.

Figure 3:
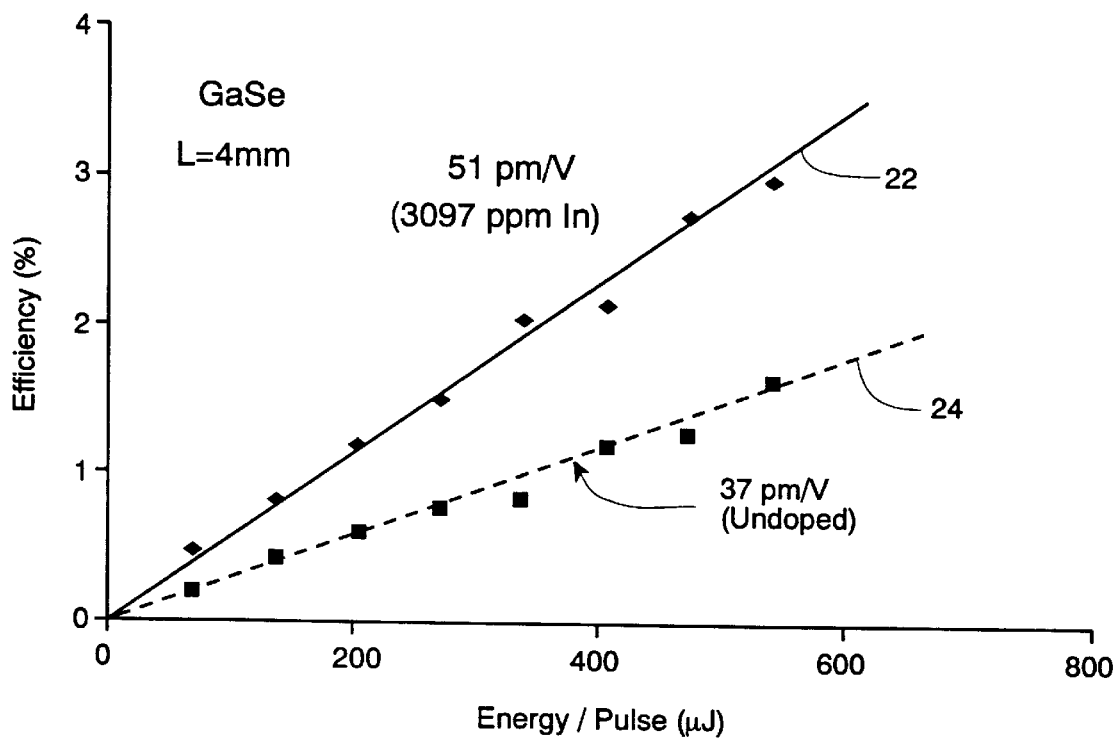
FIG. 3 is a graph showing the relative efficiencies of indium doped versus non-indium doped GaSe 4 mm crystals at different pulse energies; and, FIG. 4 is a graph of the measured effective d coefficients for doped and pure GaSe crystals cut to different lengths.

The input pulse energy was measured separately with a power meter and the internal energy was scaled from the transmission through the entrance surface. As a function of the internal pulse energy, the measured efficiencies of the 4 mm long GaSe crystals are shown in FIG. 3, where it can be seen that the doped sample 22 gives nearly twice the efficiency of the pure, or undoped, crystal 24. The energy/pulse refers to that inside the crystals. An indium doped 4 mm long crystal gave the highest d value of 51 pm/V, while an 4 mm long undoped sample gave the lowest at 37 pm/V. The crystals were also cleaved into 1- and 2-mm lengths and the SHG efficiency was always higher for the doped sample.

The slope of the efficiency data as a function of pulse energy was used to determine the effective nonlinear coefficient for each crystal length. In the small-signal regime, the data should be linear, and the highest measured efficiency was less than 6%, which should still be linear. Much higher efficiencies are possible with GaSe and an efficiency of 36% was recently measured.

The effective nonlinear coefficient was extracted from the efficiency measurements, using the focused Gaussian beam theory of Boyd and Kleinman, described in G. D. Boyd and D. A. Kleinman, "Parametric Interaction of Focussed Gaussian Light Beams," J. Appl. Phys., vol. 39, pp. 3597–3669 (1968). Both focusing and double refraction are accounted for with this theory and the theoretical second harmonic power, $P_2$ is given by $$P_2 = K P_1^2 L k_1 h(B\xi) \quad (1)$$

Where $P_1$ is the fundamental input power, L is the interaction length, $K_1 = 2\pi n/\lambda_0$ with n the index of refraction of the input beam (and of the output beam under phase-matched conditions), and $h(B_1\xi)$ is the Boyd and Kleinman efficiency factor. The double refraction parameter is $B = (\rho/2)(k_1 L)^{1/2}$, where $\rho$ is the walk-off angle between the phase and power flow directions. A walk-off angle of 3.4° was assumed, which is the predicted value using the Sellmeier equations at the predicted phase matching angle. The focusing parameter is $\xi = L/b$, where b is the length for the confocal configuration over which the beam diameter is less than $2^{1/2}\omega_o$. It is given by $b = k_1 \omega_o^2$, and the efficiency scaling constant in mks units is $$K = 8\pi d^2 / c\epsilon_o n^3 \lambda_o^2 \quad (2)$$

where $\epsilon_o$ is the permittivity of free space, c is the vacuum velocity of light and d is the effective nonlinear coefficient in meters per volt.

The measured efficiency is the total second harmonic energy compared to the fundamental pulse energy, and is given by $\eta = \int P_2 \, dt / \int P_1 \, dt$, where the integrals are over the temporal duration of the pulse. This efficiency can be related to the time independent theory by measuring the fundamental pulse shape and integrating Eq. (1) over time. The result is $$\eta = KLk_1 h(B,\xi) \int P_\lambda^2 dt / \int P_\lambda dt \quad (3)$$

so that by measuring the temporal pulse shape of the fundamental, the experimental efficiency can be related to the theoretical.

Using these equations, along with the measured pulse shape, the effective d coefficient was calculated by matching theory to the data. For type I phase matching, $d_{eff} = -d_{22} \cos(\theta) \sin(3\phi)$, where $\theta$ is the azimuthal angle. Since the crystal was oriented for maximum output, $\sin(3\phi) = 1$ and $\theta = 13°$, so $d_{eff}$ is ~3% smaller than $d_{22}$.

Figure 4:
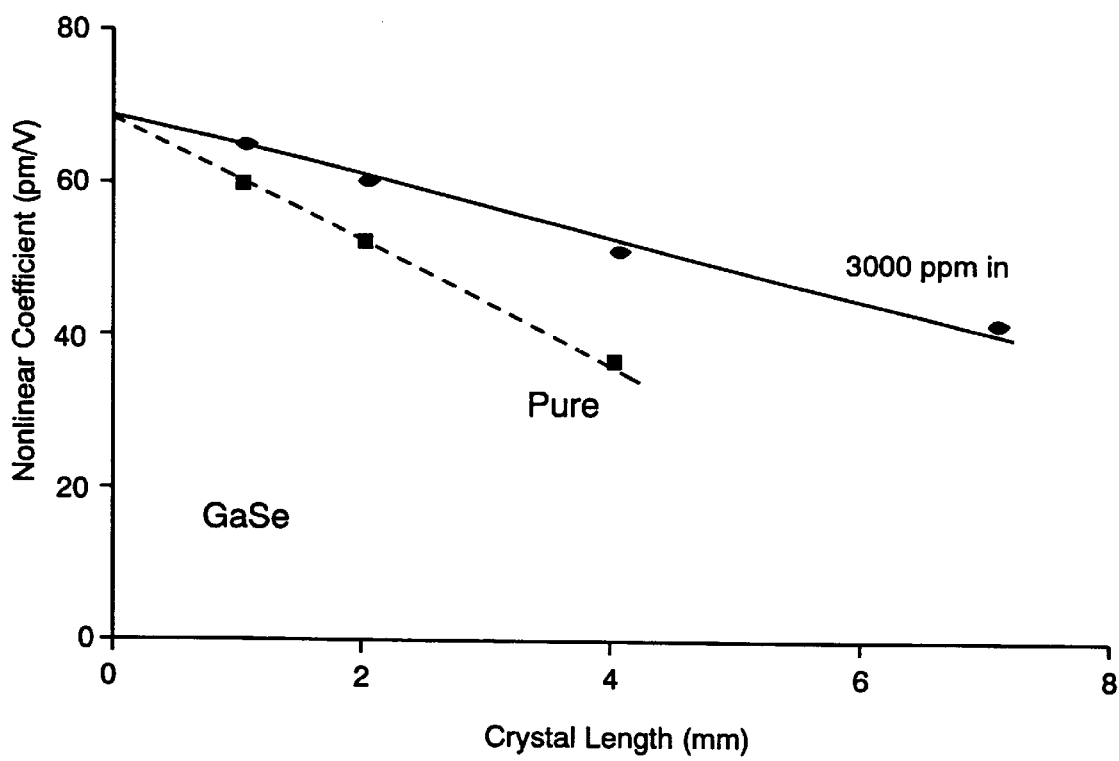

The results are shown in FIG. 4, in which the different d values are plotted as a function of crystal length. The variation in the d value is due to crystal quality, which reduces the effective interaction length and gives a smaller effective d value, even though all the crystals were cleaved from the same doped or pure boules.

Crystal quality becomes less important for shorter crystals, and a simple linear extrapolation of the effective d coefficients to a zero length, as indicated in FIG. 4, gave roughly the same d value of ~70 pm/V for both the doped and the pure samples. This demonstrates that indium doping at this level does not increase the intrinsic nonlinear coefficient and that the increase in SHG for longer crystals is due to better crystal quality, rather than a fundamental change in the d value. Different d values that are near the ~70 pm/V value of d, such as 54.4, 63 and 75 pm/V have been quoted in the literature.

With the improved crystal quality of the doped samples, a higher effective d value would be expected. For a perfect crystal, the SHG output should increase as $L^2$ and a smaller effective d value for a longer crystal would result. This would explain the reduced d value measured with the 7 mm doped crystal which was cleaved from the same boule as the shorter doped sample.

Besides having a high d value, GaSe is also very resistant to optical damage. The GaSe samples could not be damaged with the pulse energy available from laser amplifier 26 under maximum gain. As much as 1.3 mJ/pulse was applied without damage, which corresponds to an energy density of 3.7 J/cm$^2$ within the focused spot area of $\pi\omega_o^2/2$, giving an intensity of 180 MW/cm$^2$. This compares to an 3 J/cm$^2$ damage limit reported in the literature at 3 $\mu$m when 100 ps pulses were applied to a GaSe crystal at an intensity of 30 GW/cm$^2$.

In a separate experiment, the laser was operated at 30 kHz and at an output of 21 W. The beam was focused through the crystal, which corresponded to an average power density of 60 kW/cm2, and the spot was held stationary without beam scanning. It was found that with only a small amount of cooling gas flowing over the surface of the crystal, it could be operated indefinitely without damage.

The level of doping of indium in the GaSe is preferably about 3000 ppm. The level is preferably as high as possible, and about 3000 ppm is believed to be about as high a level of doping that can be accomplished and still maintain crystallinity of the resulting crystal.

The disclosed indium doped GaSe crystal and method successfully demonstrates the advantages of using indium as a dopant for GaSe crystals. Although the disclosed invention is specialized, its teachings will find application in other areas where a properly selected dopant may promote improved physical properties of a material.

Those with skill in the art of the invention will readily see that the described method for making an indium doped GaSe crystal is but one of many possible methods for making such a crystal and that the invention is not limited to that particular embodiment. Similarly, the resulting indium doped GaSe crystals may not be exactly in the physical form described in this detailed description, yet still fall within the claims. It is understood, therefore, that modifications to the invention may be made, as might occur to one with skill in the field of this invention, within the scope of the appended claims. All embodiments contemplated have not been shown in complete detail. Other embodiments may be developed without departing from the spirit of this invention or from the scope of the claims.

We claim:

1. A method for making a nonlinear optical crystal, comprising the steps of:

(a) providing gallium selenide;

(b) doping the gallium selenide with indium; and, (c) forming a crystal from the indium-doped gallium selenide.

2. The method for making according to claim 1, wherein the level of indium doping is about 3000 ppm.

3. A composition of matter, comprising an indium-doped gallium selenide crystal.

4. The composition of matter according to claim 3, wherein the level of indium doping is about 3000 ppm.

5. A composition of matter, consisting of an indium-doped gallium selenide crystal.

6. The composition of matter according to claim 5, wherein the level of indium doping is about 3000 ppm.

7. A method for converting the frequency of a monochromatic source to a different frequency, comprising the steps of:

(a) providing a source of monochromatic light at a preselected frequency; and, (b) optically coupling the output from the source of monochromatic light to a crystal of indium-doped gallium selenide.

8. The method for converting the frequency of a monochromatic source to a different frequency according to claim 7, wherein the level of indium doping is about 3000 ppm.

9. A frequency conversion apparatus, comprising:

(a) a source capable of producing monochromatic light at a preselected frequency; and, (a) an indium-doped gallium selenide crystal optically coupled with the source of monochromatic light.

10. The frequency conversion apparatus according to claim 9, wherein the level of indium doping is about 3000 ppm.

* * * * *